(12) United States Patent
Deng

(10) Patent No.: US 10,222,817 B1
(45) Date of Patent: Mar. 5, 2019

(54) METHOD AND CIRCUIT FOR LOW VOLTAGE CURRENT-MODE BANDGAP

(71) Applicant: Cavium, LLC, Santa Clara, CA (US)

(72) Inventor: JingDong Deng, Acton, MA (US)

(73) Assignee: Cavium, LLC, Santa Clara, CA (US)

( * ) Notice: Subject to any disclaimer, the term of this patent is extended or adjusted under 35 U.S.C. 154(b) by 0 days.

(21) Appl. No.: 15/721,236

(22) Filed: Sep. 29, 2017

(51) Int. Cl.
G05F 3/26 (2006.01)
H03L 3/00 (2006.01)

(52) U.S. Cl.
CPC ............... *G05F 3/262* (2013.01); *H03L 3/00* (2013.01)

(58) Field of Classification Search
None
See application file for complete search history.

(56) References Cited

U.S. PATENT DOCUMENTS

| 5,867,013 | A | 2/1999 | Yu |
| 8,797,094 | B1* | 8/2014 | Washburn ............... G05F 1/561 323/313 |
| 9,898,029 | B2* | 2/2018 | Rasmus ................. G05F 3/245 |
| 9,898,030 | B2* | 2/2018 | Lahiri .................... G05F 3/30 |
| 9,952,617 | B1* | 4/2018 | Gupta .................... G05F 3/262 |
| 2004/0124822 | A1 | 7/2004 | Marinca |
| 2005/0001605 | A1 | 1/2005 | Marinca |
| 2005/0122091 | A1 | 6/2005 | Marinca |
| 2006/0001413 | A1 | 1/2006 | Marinca |
| 2006/0017519 | A1 | 1/2006 | Pernia et al. |
| 2006/0103455 | A1 | 5/2006 | Zhang et al. |
| 2007/0152740 | A1 | 7/2007 | Georgescu et al. |
| 2008/0100392 | A1 | 5/2008 | Pernia et al. |
| 2008/0197912 | A1 | 8/2008 | Pannwitz |
| 2008/0265860 | A1 | 10/2008 | Dempsey et al. |
| 2009/0160538 | A1 | 6/2009 | Marinca |
| 2009/0243711 | A1 | 10/2009 | Marinca |
| 2009/0302822 | A1 | 12/2009 | Chao et al. |
| 2010/0148857 | A1 | 6/2010 | Chellappa |
| 2010/0156384 | A1 | 6/2010 | Ozalevli et al. |
| 2013/0038317 | A1 | 2/2013 | Marinca |
| 2013/0328542 | A1 | 12/2013 | Wang et al. |

(Continued)

OTHER PUBLICATIONS

Banba, H., et al., "A CMOS Bandgap Reference Circuit With Sub-1-V Operation," IEEE Journal of Solid-State Circuits, 34(5): 670-674 (May 1999).

(Continued)

*Primary Examiner* — Cassandra Cox
(74) *Attorney, Agent, or Firm* — Hamilton, Brook, Smith & Reynolds, P.C.

(57) ABSTRACT

A bandgap reference (BGR) circuit and method generates a constant voltage reference that is stable over temperature variations. The BGR circuit is composed of a proportional to absolute temperature (PTAT) stage, a complementary to absolute temperature (CTAT) stage, and an output stage interposed between the PTAT stage and the CTAT stage. The PTAT stage is configured to produce a PTAT current and the CTAT stage is configured to produce a CTAT current. The BGR circuit is configured to mirror the PTAT current and mirror the CTAT current to produce a mirrored PTAT current and a mirrored CTAT current in the output stage and the output stage is configured to combine the mirrored PTAT current and the mirrored CTAT current to generate the constant voltage reference.

20 Claims, 5 Drawing Sheets

(56) References Cited

U.S. PATENT DOCUMENTS

| | | | |
|---|---|---|---|
| 2014/0049317 A1 | 2/2014 | Manetakis | |
| 2014/0340143 A1* | 11/2014 | Georgiou | G05F 3/245 |
| | | | 327/541 |
| 2015/0137896 A1* | 5/2015 | Gajda | H03L 1/02 |
| | | | 331/57 |
| 2016/0077541 A1 | 3/2016 | Marinca | |
| 2016/0098048 A1* | 4/2016 | Sharma | H03F 3/45771 |
| | | | 327/513 |
| 2016/0138978 A1 | 5/2016 | Eberlein | |
| 2016/0238464 A1 | 8/2016 | Eberlein | |
| 2016/0265983 A1* | 9/2016 | Hsu | G01K 13/00 |
| 2016/0315624 A1* | 10/2016 | Tung | H03L 1/022 |
| 2017/0131736 A1* | 5/2017 | Acar | G05F 3/267 |
| 2017/0153659 A1 | 6/2017 | Quelen | |
| 2017/0255220 A1* | 9/2017 | Sivakumar | G05F 3/267 |
| 2018/0032097 A1* | 2/2018 | Liou | G05F 3/262 |
| 2018/0101190 A1* | 4/2018 | Lee | G05F 3/262 |

OTHER PUBLICATIONS

Xing, H., et al., "Characterization of a Current-Mode Bandgap Circuit Structure for High-Precision Reference Applications," IEEE International Symposium on Circuits and Systems: 569-572 (2006).

\* cited by examiner

METHOD AND CIRCUIT FOR LOW VOLTAGE CURRENT-MODE BANDGAP

BACKGROUND

A bandgap voltage reference circuit is a circuit that produces a temperature independent voltage reference, also referred to interchangeably herein as a bandgap voltage reference, that is useful in integrated circuits. The bandgap voltage reference is a fixed (i.e., constant) voltage regardless of power supply variations, temperature changes, and circuit loading from a device that employs it. A bandgap voltage reference is commonly a voltage reference at around 1.25 V, that is, a voltage value that is close to a theoretical 1.22 V bandgap of silicon.

SUMMARY

According to an example embodiment, a circuit for generating a constant voltage reference may comprise a proportional to absolute temperature (PTAT) stage configured to produce a PTAT current, a complementary to absolute temperature (CTAT) stage configured to produce a CTAT current, and an output stage interposed between the PTAT stage and the CTAT stage. The circuit may be configured to mirror the PTAT current and mirror the CTAT current to produce a mirrored PTAT current and a mirrored CTAT current in the output stage. The output stage may be configured to combine the mirrored PTAT current and the mirrored CTAT current to generate the constant voltage reference.

Circuit elements of the circuit may be composed of a silicon material and the constant voltage generated may be independent of temperature and no greater than a bandgap voltage of the silicon material.

The output stage may include a resistor and the constant voltage reference may be constant across the resistor and may be independent of temperature.

The PTAT stage may include an operational amplifier and the circuit may further comprise a start-up stage that includes a start-up circuit that may be coupled to an output terminal of the operational amplifier. The start-up circuit may be configured to sense the output terminal of the operational amplifier and couple the output to a ground reference to cause a flow of current in the circuit and to shut down, automatically, in response to the flow.

The circuit may further comprise a first current mirror and a second current mirror. The first current mirror may be configured to mirror the PTAT current and the second current mirror may be configured to mirror the CTAT current.

The first current mirror may be composed of a first p-channel metal-oxide-semiconductor field-effect transistor (MOSFET) and a second p-channel MOSFET included in the PTAT stage and a third p-channel MOSFET included in the output stage. The second current mirror may be composed of a fourth p-channel MOSFET included in the output stage and a fifth p-channel MOSFET in the CTAT stage. The third p-channel MOSFET and the fourth p-channel MOSFET may be configured in parallel in the output stage.

The PTAT stage may be composed of the first p-channel MOSFET, the second p-channel MOSFET, an operational amplifier, a resistor, a first diode, and a second diode. An output terminal of the operational amplifier may be coupled to a first gate of the first p-channel MOSFET and a second gate of the second p-channel MOSFET. A negative input terminal of the operational amplifier may be coupled to the first p-channel MOSFET, the first diode, and a first drain of the first p-channel MOSFET. A positive input terminal of the operational amplifier may be coupled to the second p-channel MOSFET, the resistor, and a second drain of the second p-channel MOSFET. The resistor may be coupled to the second diode.

The CTAT stage may be composed of a p-channel MOSFET, an operational amplifier, and a resistor. The resistor may be coupled to a drain of the p-channel MOSFET. The drain may be coupled to a positive input terminal of the operational amplifier. A negative input terminal of the operational amplifier may be coupled to the PTAT stage and an output terminal of the operational amplifier is coupled to a gate of the p-channel MOSFET.

The PTAT stage may include a first operational amplifier with a first negative input terminal, the CTAT stage may include a second operational amplifier with a second negative input terminal, and the first negative input terminal may be coupled to the second negative input terminal.

The PTAT stage may further include a p-channel MOSFET and a diode and the first negative input terminal may be coupled further to the p-channel MOSFET and the diode.

According to another example embodiment, a method for generating a constant voltage reference may comprise producing a proportional to absolute temperature (PTAT) current in a PTAT stage of a circuit, producing a complementary to absolute temperature (CTAT) current in a CTAT stage of the circuit, mirroring the PTAT current and mirroring the CTAT current in an output stage of the circuit to produce a mirrored PTAT current and a mirrored CTAT current in the output stage. The output stage may be interposed between the PTAT stage and the CTAT stage. The method may comprise combining the mirrored PTAT current and the mirrored CTAT current in the output stage to generate the constant voltage reference.

Circuit elements of the circuit may be composed of a silicon material and the constant voltage generated may be independent of temperature and may be no greater than a bandgap voltage of the silicon material.

The method may further comprise including a resistor in the output stage. The constant voltage reference may be constant across the resistor and may be independent of temperature.

The circuit may further comprise an operational amplifier in the PTAT stage and a start-up stage and the method may further comprise coupling a start-up circuit of the start-up stage to an output terminal of the operational amplifier, sensing the output terminal of the operational amplifier by the start-up circuit, coupling the output to a ground reference by the start-up circuit in response to the sensing to cause a flow of current in the circuit, and shutting down the start-up circuit, automatically, in response to the flow.

The circuit may further comprise a first current mirror and a second current mirror and the method may further comprise mirroring the PTAT current via the first current mirror and mirroring the CTAT current via the second current mirror.

The method may further comprise forming the first current mirror via a first p-channel metal-oxide-semiconductor field-effect transistor (MOSFET) and a second p-channel MOSFET included in the PTAT stage and a third p-channel MOSFET included in the output stage. The method may further comprise forming the second current mirror via a fourth p-channel MOSFET included in the output stage and a fifth p-channel MOSFET in the CTAT stage and configuring the third p-channel MOSFET and the fourth p-channel MOSFET, in parallel, in the output stage.

The PTAT stage may be composed of the first p-channel MOSFET, the second p-channel MOSFET, an operational amplifier, a resistor, a first diode, and a second diode, and the method may further comprise coupling an output terminal of the operational amplifier to a first gate of the first p-channel MOSFET and a second gate of the second p-channel MOSFET. The method may further comprise coupling a negative input terminal of the operational amplifier to the first p-channel MOSFET, the first diode, and a first drain of the first p-channel MOSFET. The method may further comprise coupling a positive input terminal of the operational amplifier to the second p-channel MOSFET, the resistor, and a second drain of the second p-channel MOSFET. The method may further comprise coupling the resistor to the second diode.

The CTAT stage may be composed of a p-channel MOSFET, an operational amplifier, and a resistor. The method may further comprise coupling the resistor to a drain of the p-channel MOSFET, coupling the drain to a positive input terminal of the operational amplifier, coupling a negative input terminal of the operational amplifier to the PTAT stage, and coupling an output terminal of the operational amplifier to a gate of the p-channel MOSFET.

The PTAT stage may include a first operational amplifier with a first negative input terminal, the CTAT stage may include a second operational amplifier with a second negative input terminal, and the method may further comprise coupling the first negative input terminal to the second negative input terminal.

The PTAT stage may further include a p-channel MOSFET and a diode and the method may further comprise coupling the first negative input terminal to the p-channel MOSFET and the diode.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

References, such as voltage references and current references, are widely used in electronic systems and a thermal stability of such references may play a key role in performance of such electronic systems. Bandgap reference (BGR) circuits may rely on a predictable variation with temperature of a bandgap energy of an underlying semiconductor material to generate such voltage and current references with thermal stability. There are generally two types of BGR circuits, referred to herein as "voltage-mode" and "current-mode" BGR configurations.

According to an example embodiment, a current-mode bandgap circuit for low voltage bandgap, that is, less than 1.2 V, generates a constant voltage reference that is stable over temperature. An example embodiment employs a separate current combination path for combining proportional to absolute temperature (PTAT) and complementary to absolute temperature (CTAT) currents that is separate from the PTAT and CTAT current generation circuits. According to an example embodiment, the current-mode bandgap circuit for low voltage bandgap has a well-defined PTAT/CTAT current convergence and, thus, increases accuracy of the low voltage bandgap.

Figure 1:
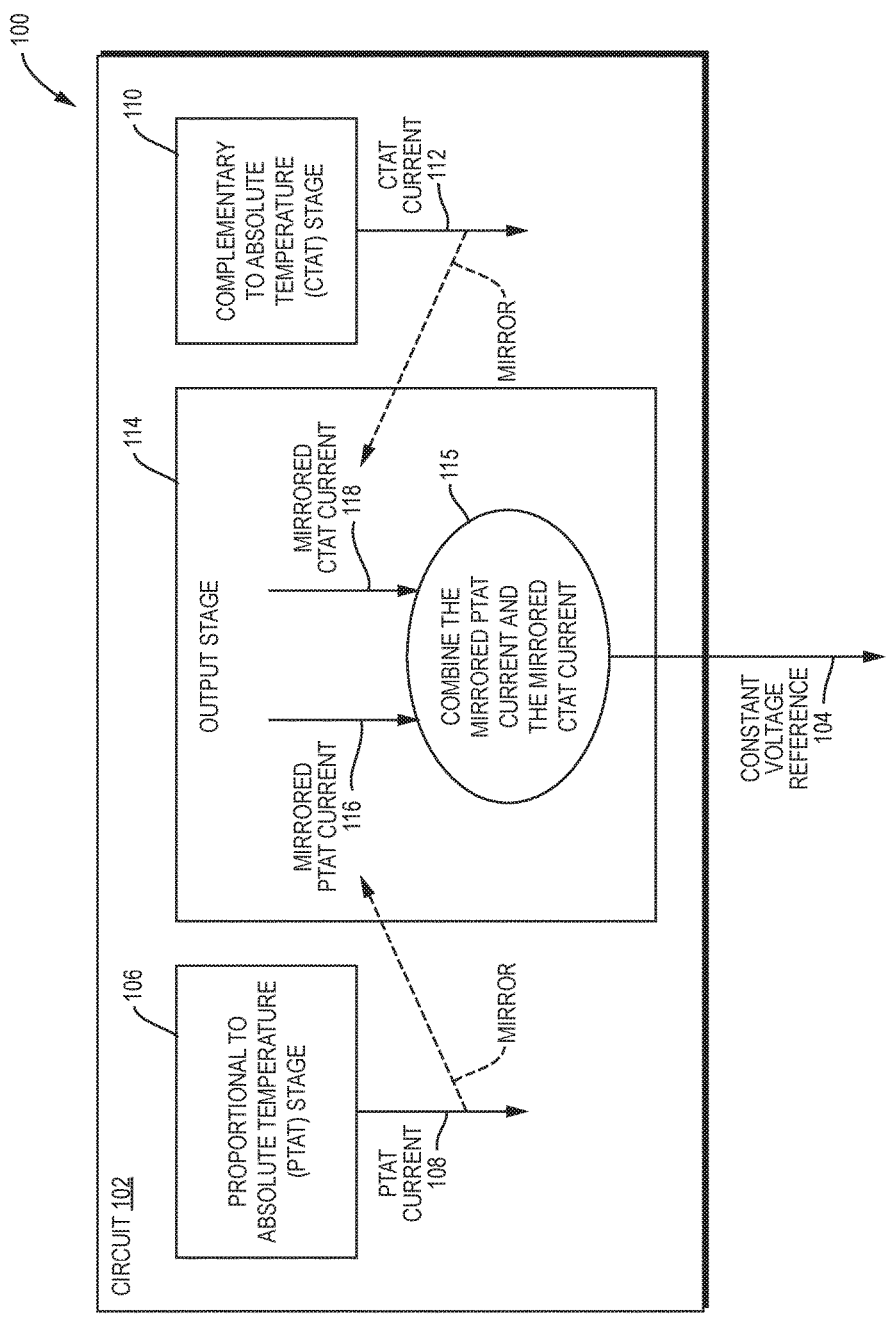
FIG. 1 is a block diagram of an example embodiment of a circuit for generating a constant voltage reference.

FIG. 1 is a block diagram 100 of an example embodiment of a circuit 102 for generating a constant voltage reference 104. The circuit 102 may comprise a PTAT stage 106 configured to produce a PTAT current 108, a CTAT stage 110 configured to produce a CTAT current 112, and an output stage 114 interposed between the PTAT stage 106 and the CTAT stage 110. The circuit 102 may be configured to mirror the PTAT current 108 and mirror the CTAT current 112 to produce a mirrored PTAT current 116 and a mirrored CTAT current 118 in the output stage 114. The output stage 114 may be configured to combine the mirrored PTAT current 116 and the mirrored CTAT current 118 to generate the constant voltage reference 104.

A stage may be referred to interchangeably herein as a circuit. According to the example embodiment of FIG. 1, a separate current combination path 115 in the output stage 114 is employed for combining the mirrored PTAT current 116 and the mirrored CTAT current 118 and the separate current combination path 115 is separate from the PTAT and CTAT current generation circuits, that is, the PTAT stage 106 and the CTAT stage 110, respectively.

Figure 2:
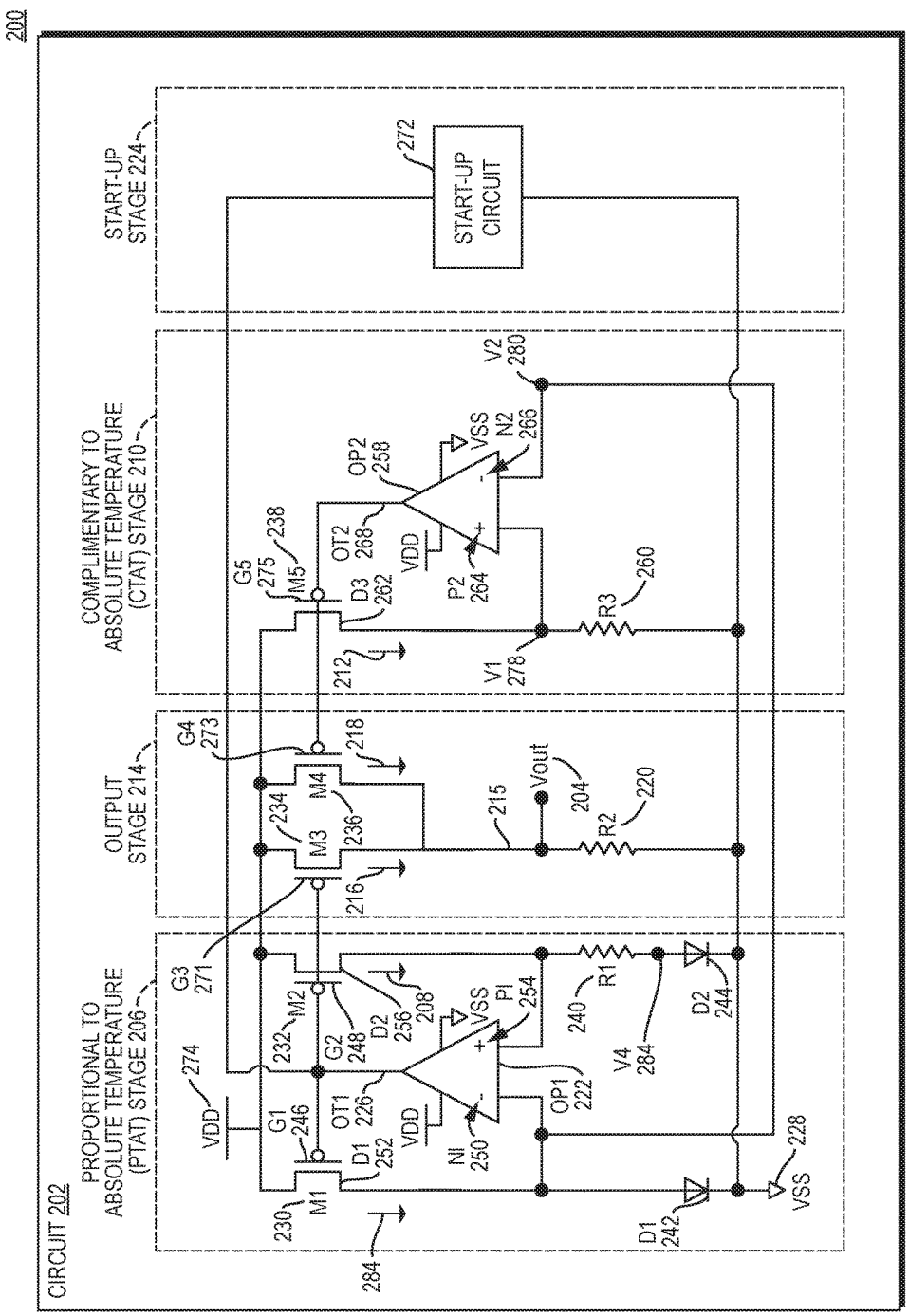
FIG. 2 is a circuit diagram of an example embodiment of the circuit of FIG. 1.

FIG. 2 is a circuit diagram 200 of an example embodiment of the circuit 102 of FIG. 1, namely a circuit 202. The circuit 202 comprises a proportional to absolute temperature (PTAT) stage 206 configured to produce a PTAT current 208, a complementary to absolute temperature (CTAT) stage 210 configured to produce a CTAT current 212, and an output stage 214 interposed between the PTAT stage 206 and the CTAT stage 210. The circuit 202 may be configured to mirror the PTAT current 208 and mirror the CTAT current 212 to produce a mirrored PTAT current 216 and a mirrored CTAT current 218 in the output stage 214. The output stage 214 may be configured to combine the mirrored PTAT current 216 and the mirrored CTAT current 218 to generate the constant voltage reference 204.

The constant voltage reference 204 may be referred to interchangeably herein as $V_{out}$, a bandgap reference (BGR) voltage. According to the example embodiment of FIG. 2, a separate current combination path 215 in the output stage 214 is employed for combining the mirrored PTAT current 216 and the mirrored CTAT current 218 and the separate current combination path 215 is separate from the PTAT and CTAT current generation circuits, that is, the PTAT stage 206 and the CTAT stage 210, respectively, as the separate current combination path 215 is located in the output stage 214.

The circuit 202, also referred to interchangeably herein as a BGR circuit, a current-mode bandgap circuit, a low voltage bandgap circuit, or a low voltage current-mode bandgap circuit, may be designed without bipolar transistors as the BGR circuit may be fabricated using a complementary metal oxide semiconductor (CMOS) process commonly used to fabricate a semiconductor device, such as a semiconductor memory, or any other suitable semiconductor device that employs a reference voltage generator.

Circuit elements of the circuit 202 may be composed of a silicon material and the constant voltage generated, that is, the constant voltage 204, may be independent of temperature and no greater than a bandgap voltage of the silicon material.

The output stage 214 may include a resistor, that is, the resistor R2 220, and the constant voltage reference 204 may be constant across the resistor R2 220 and may be independent of temperature.

The PTAT stage 206 may include an operational amplifier, that is, the operational amplifier OP1 222, and the circuit 202 may further comprise a start-up stage 224 with a start-up circuit 272 coupled to an output terminal OT1 226 of the operational amplifier OP1 222. The start-up circuit 272 may be configured to sense the output terminal OT1 226 of the operational amplifier OP1 222 and couple the output terminal OT1 226 to a ground reference 228 to cause a flow of current in the circuit 202 and to shut down, automatically, in response to the flow.

The start-up circuit 272 may shut down in any suitable way, such as by de-activating or entering a passive or reset state. As power, that is, the power supply voltage VDD 274, is first applied to the circuit 202, the circuit 202 may be in a locked and stable state; however, the circuit 202 may be in non-operational mode in which there is no current flowing in the circuit 202.

For example, a voltage at the output terminal OT1 226 of the operational amplifier OP1 222 of the PTAT stage 206 may be at a high voltage level, such as a voltage level that is close to the power supply voltage VDD 274, preventing any current from flowing through p-channel metal-oxide-semiconductor field-effect transistors (MOSFETs) of the circuit 202. According to an example embodiment, the power supply voltage VDD 274 may be at a low voltage value, that is, less than 1.2 V. The start-up circuit 272 may be configured to sense the voltage at the output terminal OT1 226 and pull it down to the ground reference 228, briefly, such that current starts flowing. Once the voltage at the output terminal OT1 226 is low enough to enable current to flow, the start-up circuit 272 may shut down automatically. For example, the start-up circuit 272 may release control over the voltage at the output terminal OT1 226.

The circuit 202 may further comprise a first current mirror and a second current mirror. The first current mirror may be configured to mirror the PTAT current 208 and the second current mirror may be configured to mirror the CTAT current 212 in the output stage 214. The first current mirror may be composed of a first p-channel MOSFET M1 230 and a second p-channel MOSFET M2 232, both included in the PTAT stage 206, and a third p-channel MOSFET M3 234 that is included in the output stage 214. The second current mirror may be composed of a fourth p-channel MOSFET M4 236 included in the output stage 214 and a fifth p-channel MOSFET M5 238 that is included in the CTAT stage 210. The third p-channel MOSFET M3 234 and the fourth p-channel MOSFET M4 236 may be configured in parallel in the output stage 214.

The PTAT stage 206 may be composed of the first p-channel MOSFET M1 230, the second p-channel MOSFET M2 232, an operational amplifier, that is, the operational amplifier OP1 222, a resistor R1 240, a first diode D1 242, and a second diode D2 244. An output terminal of the operational amplifier OP1 222, that is, the output terminal OT1 226, may be coupled to a first gate G1 246 of the first p-channel MOSFET M1 230 and a second gate G2 248 of the second p-channel MOSFET M2 232. The first gate G1 246 and the second gate G2 248 may be further coupled to a third gate G3 271 of the third p-channel MOSFET M3 234 that is included in the output stage 214.

A negative input terminal N1 250 of the operational amplifier OP1 222 may be coupled to the first p-channel MOSFET M1 230, the first diode D1 242, and a first drain D1 252 of the first p-channel MOSFET M1 230. A positive input terminal P1 254 of the operational amplifier OP1 222 may be coupled to the second p-channel MOSFET M2 232, the resistor R1 240, and a second drain D2 256 of the second p-channel MOSFET M2 232. The resistor R1 240 may be coupled to the second diode D2 244. The first diode D1 242 and the second diode D2 244 may be coupled to the ground reference 228.

The CTAT stage 210 may be composed of a p-channel MOSFET, that is, a fifth p-channel MOSFET M5 238, an operational amplifier, that is the operational amplifier OP2 258, and a resistor, that is, the resistor R3 260. The resistor R3 260 may be coupled to a drain D3 262 of the p-channel MOSFET M5 238. The drain D3 262 may be coupled to a positive input terminal P2 264 of the operational amplifier OP2 258. A negative input terminal N2 266 of the operational amplifier OP2 258 may be coupled to the PTAT stage 206. An output terminal OT2 268 of the operational amplifier OP2 258 may be coupled to a fourth gate G4 273 of the fourth p-channel MOSFET M4 236 of the output stage 214 and a fifth gate G5 275 of the fifth p-channel MOSFET M5 238 of the CTAT stage 210.

The PTAT stage 206 may include a first operational amplifier, that is, the operational amplifier OP1 222, with a first negative input terminal, that is, the negative input terminal N1 250. The CTAT stage 210 may include a second operational amplifier, that is, the operational amplifier OP2 258, with a second negative input terminal, that is, the negative input terminal N2 266. The first negative input terminal N1 250 may be coupled to the second negative input terminal N2 266. The first negative input terminal N1 250 may be coupled further to the first p-channel MOSFET M1 230 and the first diode D1 242.

According to an example embodiment, the p-channel MOSFETs of the circuit 202, that is, the first p-channel MOSFET M1 230, the second p-channel MOSFET M2 232, the third p-channel MOSFET M3 234, the fourth p-channel MOSFET M4 236, and the fifth p-channel MOSFET M5 238 may be of a same dimension and the first diode D1 242 may be smaller relative to the second diode D2 244.

The first operational amplifier OP1 222 and the second operational amplifier OP2 258 may be so controlled that voltages of their respective negative and positive input terminals are equalized. For example, voltages at the first negative input terminal N1 250 and the first positive input terminal P1 254 are equalized while voltages at the second negative input terminal N2 266 and the second positive input terminal P2 264 are equalized.

Gates of the first p-channel MOSFET M1 230 and the second p-channel MOSFET M2 230, of the PTAT stage 206, and the third p-channel MOSFET M3 234 of the output stage 214 may be connected to a first common node, that is, the output terminal OT1 226 of the first operational amplifier OP1 222 of the PTAT stage 206, forming the first current mirror. The first current mirror may cause the PTAT current 208 and a first mirrored PTAT current 216 and a second mirrored PTAT current 284 to have a same PTAT current value due to the first current mirror.

Gates of the fourth p-channel MOSFET M4 236 of the output stage 214 and the fifth p-channel MOSFET M5 238 of the CTAT stage may be connected to a second common node, that is, the output terminal OT2 268 of the second operational amplifier OP2 258 located in the CTAT stage 210, forming the second current mirror and causing the CTAT current 212 of the CTAT stage to be mirrored as the mirrored CTAT current 218 of the output stage 214 and to have a same CTAT current value due to the second current mirror.

According to an example embodiment, in the circuit 202, the voltages V1 278, V2 280, and V3 282, also referred to herein as the CTAT voltages, may be equal to one another and have a voltage value of:

$$V_{bg} - a*T,$$

where $V_{bg}$ is the silicon band gap voltage, a is technology constant, and T is the absolute temperature.

According to an example embodiment, the mirrored CTAT current 218 of the output stage 214 may be equal to the CTAT current 212 of the CTAT stage 210 and the CTAT current 212 may be derived by dividing the voltage V1 278 by a resistance value of the resistor R3 260 of the CTAT stage 210, that is:

$$(V_{bg} - a*T)/R3.$$

A PTAT voltage across the resistor R1 240, that is, a difference between the voltage V3 282 and the voltage V4 284 is:

$$b*T,$$

where b is a circuit constant for the circuit 202 that can be adjusted by adjusting a diode area ratio of a diode area of the second diode D2 244 with respect to another diode area of the first diode D1 242.

The PTAT current 208 may be derived from the difference between the voltage V3 282 and the voltage V4 284, that is, b*T, and by dividing the difference by a resistance value of the resistor R1 240 of the PTAT stage 206. As such, the PTAT current 208 may be:

$$b*T/R1,$$

and the first mirrored PTAT current 216 in the output stage 214 as well as the second mirrored PTAT current 284 of the PTAT stage 206 are equal to the PTAT current 208.

As such, according to an example embodiment, the constant voltage reference 204, that is, $V_{out}$, may be given by:

$$V_{out} = \text{(the mirrored PTAT current 216+the mirrored CTAT current 218)}*R2, \text{ which is:}$$

$$V_{out} = ((V_{bg} - a*T)/R3 + b*T/R1)*R2.$$

By adjusting b, R3, and R1, the a*T and b*T terms cancel, which leaves:

$$V_{out} = V_{bg}/R3*R2.$$

As such, the constant voltage reference 204, that is, $V_{out}$, is independent of temperature.

Turning back to FIG. 2, in the circuit 202, also referred to interchangeably herein as a current-mode bandgap circuit, there is no current following in the circuit 203 upon power up. A voltage at the output terminal OT1 226 of the operational amplifier OP1 222 is close to the power supply voltage VDD 274. After the start-up circuit 272 kicks in, that is, activates, the voltage at the output terminal OT1 226 begins to decrease, causing current to flow, and voltages at the negative input terminal N1 250 and the positive input terminal P1 254 of the operational amplifier OP1 222 rise.

The operational amplifier OP1 222 starts to operate and attempts to enforce voltages at the negative input terminal N1 250 and the positive input terminal P1 254 to be equal, via feedback. The operational amplifier OP1 222 does this by controlling an output voltage at the output terminal OT1 226 and, thus, controls the PTAT current 208 and the mirrored PTAT current 284 (which are identical) in the PTAT stage 206.

Initially, when PTAT current 208 and the mirrored PTAT current 284 in the PTAT stage 206 are still low, a voltage at V2 280 is larger than a voltage at V3 282 because at such a low current condition, a diode voltage drop dominates. The diode voltage drop V2 280 dominates since, according to an example embodiment, a diode area of the first diode D1 242 is smaller than another diode area of the second diode D2 244, and the smaller diode is more resistive. Since the voltage V2 280 is applied to the negative input terminal N1 250 of the operational amplifier OP1 222, the output voltage at the output terminal OT1 226 decreases, causing current to increase. Equilibrium is reached when the current is large enough that a voltage drop across the resistor R1 240 of the PTAT stage 206 balances out a difference between diodes sizes of the first diode D1 242 and the second diode D2 244 of the PTAT stage 206.

Figure 3A:
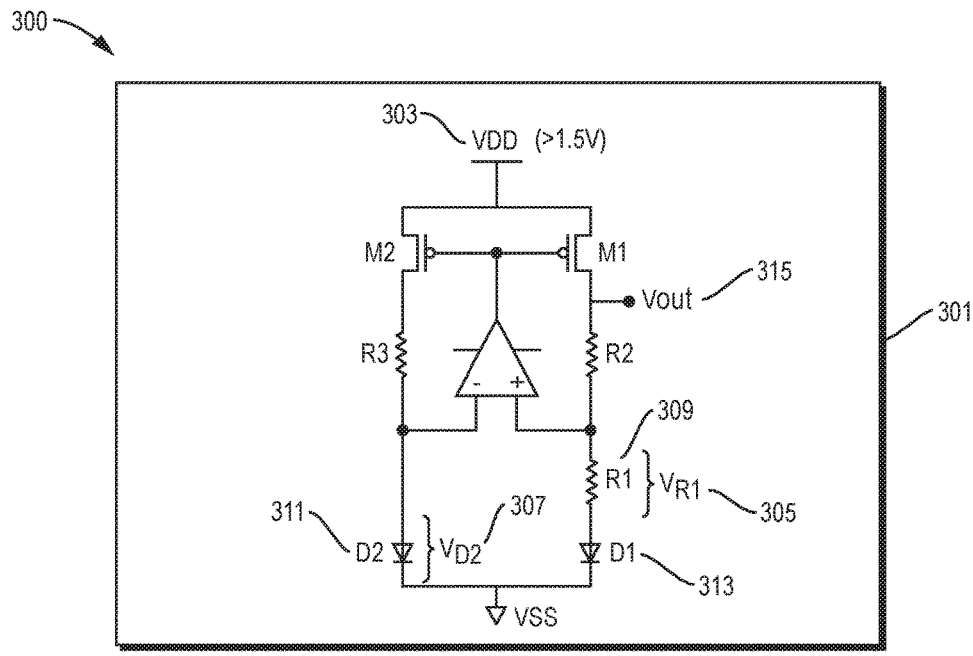
FIG. 3A is a circuit diagram of an example embodiment of a prior art high voltage voltage-mode bandgap reference (BGR) circuit.

FIG. 3A is a circuit diagram 300 of an example embodiment of a prior art high voltage voltage-mode bandgap reference (BGR) circuit 301. The BGR circuit 301 has a high voltage, that is, greater than 1.5 V supply voltage VDD 303. The BGR circuit 301 is a voltage-mode BGR circuit. The BGR circuit 301 may be configured to scale and add PTAT and CTAT voltages, that is, the PTAT voltage $V_{R1}$ 305 and the CTAT voltage $V_{D2}$ 307, that are voltages across a resistor R1 309 and a first diode D2 311, respectively.

In the example embodiment, the first diode D2 311 and a second diode D1 313 have a size relationship based on a constant k, that is, D1=k*D2. The PTAT voltage $V_{R1}$ 305, is given by:

$$V_{R1} = kT/q * \ln(k),$$

where T is temperature, q is charge, kT/q may be referred to as a thermal voltage, and "ln" denotes a natural log operation. The CTAT voltage $V_{D2}$ 307 is given by:

$$V_{D2} \approx V_{bg} - m*kT/q,$$

where $V_{bg}$ is the silicon bandgap voltage of 1.2 V and m is a known value based on a die used for fabrication and is associated with a property of the first diode D2 311. The circuit 301 scales and adds the PTAT and CTAT voltages, that is, $V_{R1}$ 305 and $V_{D2}$ 307, to cancel temperature dependency and generate $V_{out}$ 315 that is approximately 1.25 V, that is, a band gap voltage of silicon material.

Figure 3B:
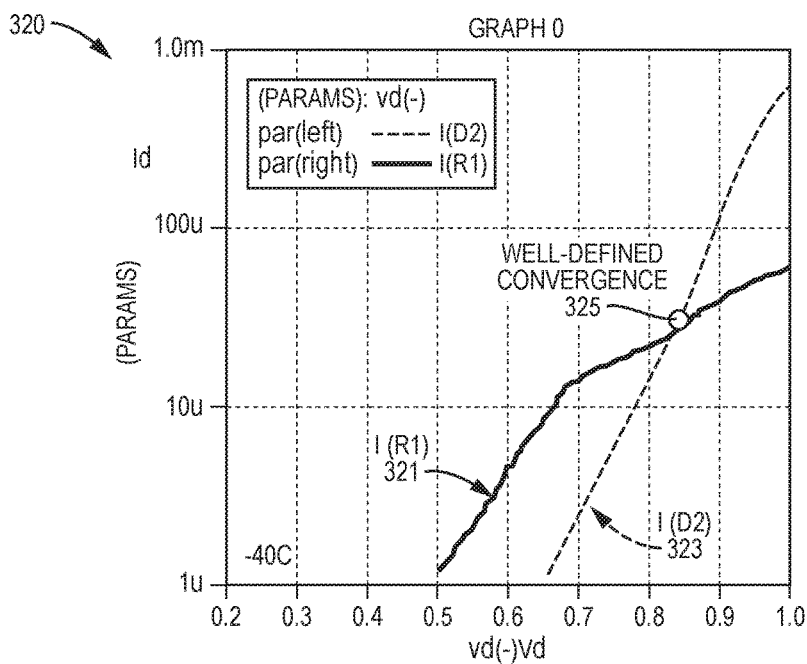
FIG. 3B is a graph of convergence for the prior art high voltage voltage-mode BGR circuit of FIG. 3A.

FIG. 3B is a graph 320 of convergence for the prior art high voltage voltage-mode BGR circuit 301 of FIG. 3A, disclosed above. In the graph 320, a PTAT current plot 321 is plot of a first current of the resistor R1 309 of FIG. 3A. The graph 320 includes a CTAT current plot 323 of a second current of the first diode D2 311 of FIG. 3A. As shown in the graph 320, the PTAT current plot 320 and the CTAT current plot 323 have a well-defined convergence 325. Such a well-defined convergence is not achieved for a case of a prior art low voltage current-mode BGR circuit, disclosed below, with reference to FIG. 3C.

Figure 3C:
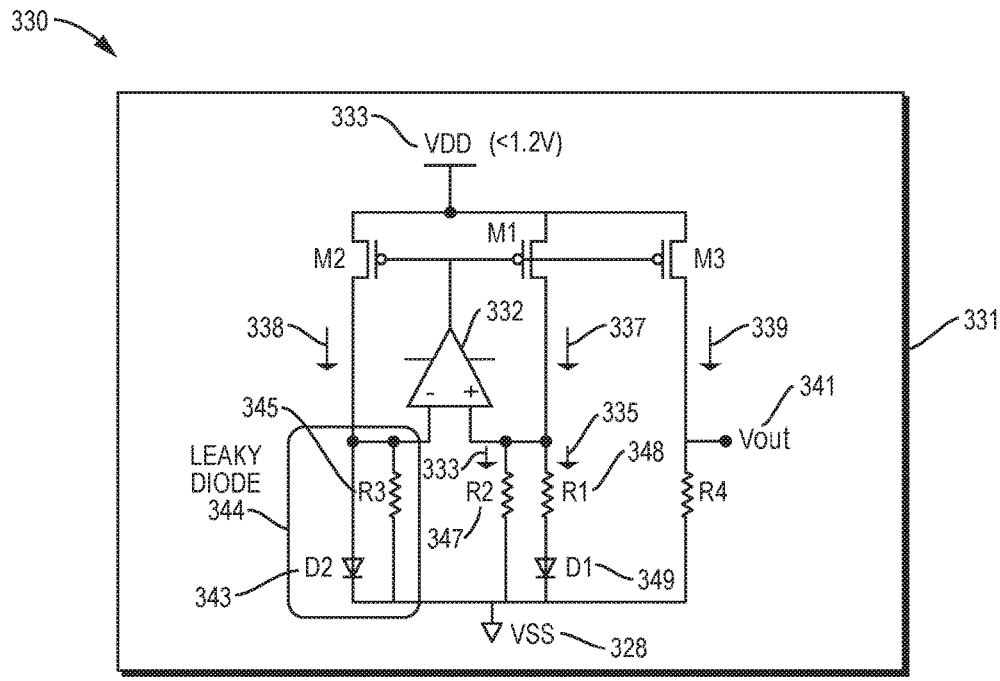
FIG. 3C is a circuit diagram of an example embodiment of a prior art low voltage current-mode BGR circuit.

FIG. 3C is a circuit diagram 330 of an example embodiment of a prior art low voltage current-mode BGR circuit 331. The BGR circuit 331 has a low voltage, that is, less than 1.2 V, supply voltage VDD 303. The BGR circuit 331 is a current-mode BGR circuit. The BGR circuit 331 may be configured to convert voltage into current and then mirror out the current and convert back to voltage. For example, a first current 337 may include a CTAT current 333 and a PTAT current 335 and the first current 337 may be mirrored as an output current 339 for generating the output voltage $V_{out}$ 341. The output voltage $V_{out}$ 341 may not be stable over temperature, however, as disclosed below with regard to FIG. 3D.

Figure 3D:
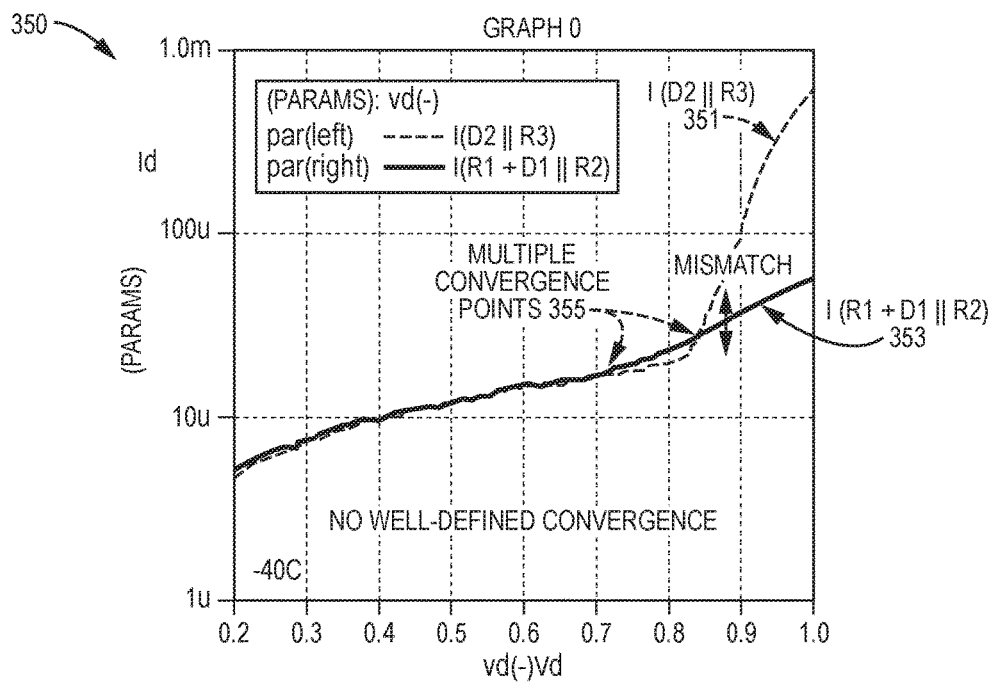
FIG. 3D is a graph of convergence for the prior art low voltage current-mode BGR circuit of FIG. 3C.

FIG. 3D is a graph 350 of convergence for the prior art low voltage current-mode BGR circuit 331 of FIG. 3C. In the graph 350, a first current plot 351 is plot of a second current 338 into the diode D2 343 and resistor R3 345, in parallel with one another in the circuit 331 of FIG. 3A, disclosed above. The graph 350 includes a second current plot 353 of the first current 337 flowing into the resistor R1 348 and the diode D1 349 in parallel with the resistor R2 347 in the circuit 331. As shown in the graph 350, there is no well-defined convergence between the first current plot 351 and the second current plot 353 as there are multiple convergence points 355.

In the prior art low voltage current-mode BGR circuit 331, there are resistors between the positive and negative input terminals of the operational amplifier 332 and the ground reference VSS 328, that is, the resistors R3 345 and R2 347, that shunt the first current 337 and the second current 338 to the ground reference VSS 328. In an event the positive and negative input terminals of the operational amplifier 332 are at a low voltage, that is, close to the ground reference VSS 328, these shunt currents can dominate over the current through the diode branches, that is, paths including the diodes D2 343 and D1 349, causing the voltage at the positive and negative input terminals to converge to a value that is different from expected, as shown by the multiple convergence points 355 in of the graph 350 of FIG. 3D, disclosed above.

Turning back to FIG. 3C, a shunting resistor, such as the resistors R3 345 and R2 347, that shunt the first current 337 and the second current 338, respectively, to the ground reference VSS 328, in combination with a diode, such as the diodes D2 343 and D1 349, may be referred to herein as a "leaky" diode 344. Due to the leaky diode 344, the current-mode bandgap, that is, $V_{out}$ 341, may converge to an incorrect value in an event of mismatch and may result in failed parts with process variations.

In contrast to the prior art low voltage current-mode BGR circuit 331 of FIG. 3C, disclosed above, an example embodiment of a low voltage current-mode bandgap circuit disclosed herein, such as the example embodiment of the circuit 202 of FIG. 2, disclosed above, presents no "leaky" diode situation and, thus, no problems with respect to convergence. An example embodiment of a low voltage current-mode bandgap circuit disclosed herein may combine PTAT and CTAT currents in a separate circuit, such as the output stage 214 that is separate with respect to the PTAT stage 206 and the CTAT stage 210 that generate that the PTAT current 208 and the CTAT current 212, respectively. By employing an additional operational amplifier, that is, the second operational amplifier OP2 258 in the CTAT stage 201, the PTAT current 208 and the CTAT current 212 may be combined in the separate circuit. According to an example embodiment of the low voltage current-mode bandgap circuit disclosed herein, such as the low voltage current-mode bandgap circuit 202 of FIG. 2, disclosed above, a well-defined convergence between PTAT and CTAT currents may be achieved, similar to the well-defined convergence 325 of FIG. 3B, disclosed above with reference to the example embodiment of the prior art high voltage voltage-mode BGR circuit 301.

Figure 4:
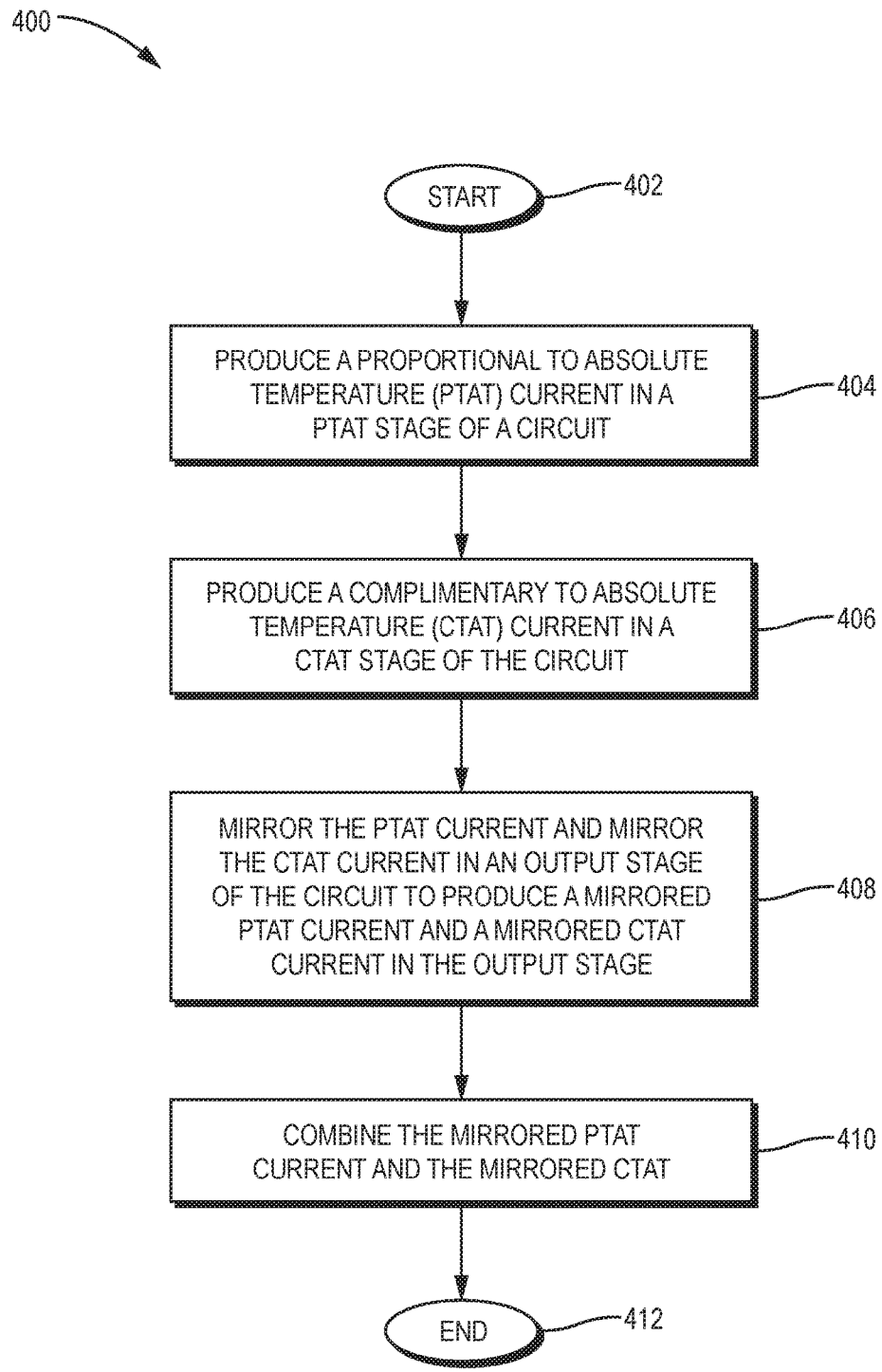
FIG. 4 is a flow diagram of an example embodiment of a method for generating a constant voltage reference.

FIG. 4 is a flow diagram 400 of an example embodiment of a method for generating a constant voltage reference. The method begins (402) and may produce a proportional to absolute temperature (PTAT) current in a PTAT stage of a circuit (404). The method may produce a complementary to absolute temperature (CTAT) current in a CTAT stage of the circuit (406) and mirror the PTAT current and mirror the CTAT current in an output stage of the circuit to produce a mirrored PTAT current and a mirrored CTAT current in the output stage (408). The output stage may be interposed between the PTAT stage and the CTAT stage. The method may combine the mirrored PTAT current and the mirrored CTAT current in the output stage to generate the constant voltage reference (410), and the method thereafter ends (412) in the example embodiment.

The method may further comprise including a resistor in the output stage, such as the resistor R2 220 of the output stage 214 of FIG. 2, disclosed above. The constant voltage reference may be constant across the resistor and may be independent of temperature.

The circuit may further comprise an operational amplifier in the PTAT stage, such as the first operational amplifier OP1 222 of the PTAT stage 206 of FIG. 2, and a start-up stage, such as the start-up stage 224 of FIG. 2, and the method may further comprise coupling a start-up circuit of the start-up stage to an output terminal of the operational amplifier, such as the start-up circuit 272 of the start-up stage 224 of FIG. 2 that is coupled to the output terminal OT1 226 of the first operational amplifier OP1 222, sensing the output terminal of the operational amplifier by the start-up circuit, coupling the output to a ground reference by the start-up circuit in response to the sensing to cause a flow of current in the circuit, and shutting down the start-up circuit, automatically, in response to the flow.

The circuit may further comprise a first current mirror and a second current mirror and the method may further comprise mirroring the PTAT current via the first current mirror and mirroring the CTAT current via the second current mirror, such as disclosed above with regard to FIG. 2.

The method may further comprise forming the first current mirror via a first p-channel metal-oxide-semiconductor field-effect transistor (MOSFET) and a second p-channel MOSFET included in the PTAT stage, such as the first p-channel MOSFET M1 230 and the second p-channel MOSFET M2 232 of the PTAT stage 206 of FIG. 2, and a third p-channel MOSFET included in the output stage, such as the third p-channel MOSFET M3 234 included in the output stage 214 of FIG. 2. The method may further comprise forming the second current mirror via a fourth p-channel MOSFET included in the output stage, such as the fourth p-channel MOSFET M4 236 included in the output stage 214 of FIG. 2, and a fifth p-channel MOSFET in the CTAT stage, such as the fifth p-channel MOSFET M5 238 included in the CTAT stage 210 of FIG. 2, and configuring the third p-channel MOSFET and the fourth p-channel MOSFET, in parallel, in the output stage.

The PTAT stage may be composed of the first p-channel MOSFET, the second p-channel MOSFET, an operational amplifier, a resistor, a first diode, and a second diode, and the method may further comprise coupling an output terminal of the operational amplifier, such as the output terminal OT1 226 of FIG. 2, to a first gate of the first p-channel MOSFET and a second gate of the second p-channel MOSFET, such as the first gate G1 246 and the second gate G2 248 of FIG.

2. The method may further comprise coupling a negative input terminal of the operational amplifier, such as the negative input terminal N1 250 of FIG. 2, to the first p-channel MOSFET, the first diode, and a first drain of the first p-channel MOSFET. The method may further comprise coupling a positive input terminal of the operational amplifier, such as the positive input terminal P1 254 of FIG. 2, to the second p-channel MOSFET, the resistor, and a second drain of the second p-channel MOSFET. The method may further comprise coupling the resistor to the second diode.

The CTAT stage may be composed of a p-channel MOSFET, an operational amplifier, and a resistor. The method may further comprise coupling the resistor to a drain of the p-channel MOSFET, such as the resistor R3 260 that is coupled to the drain D3 262 in FIG. 2, coupling the drain to a positive input terminal of the operational amplifier, such as to the positive input terminal P2 264 of FIG. 2, coupling a negative input terminal of the operational amplifier to the PTAT stage, such as the negative input terminal N2 266 that is coupled to the PTAT stage 206 of FIG. 2, and coupling an output terminal of the operational amplifier to a gate of the p-channel MOSFET, such as the output terminal OT 268 that is coupled to the gate G5 275 in FIG. 2, disclosed above.

The PTAT stage may include a first operational amplifier with a first negative input terminal, the CTAT stage may include a second operational amplifier with a second negative input terminal, and the method may further comprise coupling the first negative input terminal to the second negative input terminal, such as the first negative input terminal N1 250 that is coupled to the second negative input terminal N2 266 in FIG. 2, disclosed above.

The PTAT stage may further include a p-channel MOSFET and a diode and the method may further comprise coupling the first negative input terminal to the p-channel MOSFET and the diode, such as the first negative input terminal N1 250 that is coupled to the first p-channel MOSFET M1 230 and the first diode 242 of FIG. 2, disclosed above.

While example embodiments have been particularly shown and described, it will be understood by those skilled in the art that various changes in form and details may be made therein without departing from the scope of the embodiments encompassed by the appended claims.

What is claimed is:

1. A circuit for generating a constant voltage reference, the circuit comprising:
    a proportional to absolute temperature (PTAT) stage configured to produce a PTAT current;
    a complementary to absolute temperature (CTAT) stage configured to produce a CTAT current;
    an output stage interposed between the PTAT stage and the CTAT stage, the circuit configured to mirror the PTAT current and mirror the CTAT current to produce a mirrored PTAT current and a mirrored CTAT current in the output stage, the output stage configured to combine the mirrored PTAT current and the mirrored CTAT current to generate the constant voltage reference; and
    a start-up circuit coupled to the PTAT stage, the start-up circuit configured to cause a flow of current in the circuit and to shut down, automatically, in response to the flow.

2. The circuit of claim 1, wherein circuit elements of the circuit are composed of a silicon material and the constant voltage generated is independent of temperature and no greater than a bandgap voltage of the silicon material.

3. The circuit of claim 1, wherein the output stage includes a resistor and the constant voltage reference is constant across the resistor and is independent of temperature.

4. The circuit of claim 1, wherein the PTAT stage includes an operational amplifier, wherein the start-up circuit is coupled to an output terminal of the operational amplifier, and wherein the start-up circuit is configured to sense the output terminal of the operational amplifier and couple the output to a ground reference to cause the flow of current in the circuit.

5. The circuit of claim 1, wherein the circuit further comprises a first current mirror and a second current mirror, the first current mirror configured to mirror the PTAT current and the second current mirror configured to mirror the CTAT current.

6. The circuit of claim 5, wherein:
    the first current mirror is composed of a first p-channel metal-oxide-semiconductor field-effect transistor (MOSFET) and a second p-channel MOSFET included in the PTAT stage and a third p-channel MOSFET included in the output stage;
    the second current mirror is composed of a fourth p-channel MOSFET included in the output stage and a fifth p-channel MOSFET in the CTAT stage; and
    the third p-channel MOSFET and the fourth p-channel MOSFET are configured in parallel in the output stage.

7. The circuit of claim 5, wherein:
    the PTAT stage is composed of the first p-channel MOSFET, the second p-channel MOSFET, an operational amplifier, a resistor, a first diode, and a second diode;
    an output terminal of the operational amplifier is coupled to a first gate of the first p-channel MOSFET and a second gate of the second p-channel MOSFET;
    a negative input terminal of the operational amplifier is coupled to the first p-channel MOSFET, the first diode, and a first drain of the first p-channel MOSFET;
    a positive input terminal of the operational amplifier is coupled to the second p-channel MOSFET, the resistor, and a second drain of the second p-channel MOSFET; and
    the resistor is coupled to the second diode.

8. The circuit of claim 1, wherein:
    the CTAT stage is composed of a p-channel MOSFET, an operational amplifier, and a resistor;
    the resistor is coupled to a drain of the p-channel MOSFET;
    the drain is coupled to a positive input terminal of the operational amplifier; and
    a negative input terminal of the operational amplifier is coupled to the PTAT stage and an output terminal of the operational amplifier is coupled to a gate of the p-channel MOSFET.

9. The circuit of claim 1, wherein:
    the PTAT stage includes a first operational amplifier with a first negative input terminal;
    the CTAT stage includes a second operational amplifier with a second negative input terminal; and
    the first negative input terminal is coupled to the second negative input terminal.

10. The circuit of claim 9, wherein the PTAT stage further includes a p-channel MOSFET and a diode and the first negative input terminal is coupled further to the p-channel MOSFET and the diode.

11. A method for generating a constant voltage reference, the method comprising:

coupling a start-up circuit to a proportional to absolute temperature (PTAT) stage of a circuit;
causing a flow of current in the circuit via the start-up circuit;
shutting down the start-up circuit, automatically, in response to the flow;
producing a PTAT current in the PTAT stage;
producing a complementary to absolute temperature (CTAT) current in a CTAT stage of the circuit;
mirroring the PTAT current and mirroring the CTAT current in an output stage of the circuit to produce a mirrored PTAT current and a mirrored CTAT current in the output stage, the output stage interposed between the PTAT stage and the CTAT stage; and
combining the mirrored PTAT current and the mirrored CTAT current in the output stage to generate the constant voltage reference.

12. The method of claim 11, wherein circuit elements of the circuit are composed of a silicon material and the constant voltage generated is independent of temperature and no greater than a bandgap voltage of the silicon material.

13. The method of claim 11, wherein the circuit includes a resistor in the output stage and wherein the constant voltage reference is constant across the resistor and is independent of temperature.

14. The method of claim 11, wherein the circuit includes an operational amplifier in the PTAT stage, wherein the coupling includes coupling the start-up circuit to an output terminal of the operational amplifier, and wherein the method further comprises:
sensing the output terminal of the operational amplifier by the start-up circuit and coupling the output to a ground reference by the start-up circuit in response to the sensing to cause the flow of current in the circuit.

15. The method of claim 11, wherein the circuit includes a first current mirror and a second current mirror and wherein the method further comprises mirroring the PTAT current via the first current mirror and mirroring the CTAT current via the second current mirror.

16. The method of claim 15, wherein the method further comprises:
forming the first current mirror via a first p-channel metal-oxide-semiconductor field-effect transistor (MOSFET) and a second p-channel MOSFET included in the PTAT stage and a third p-channel MOSFET included in the output stage;
forming the second current mirror via a fourth p-channel MOSFET included in the output stage and a fifth p-channel MOSFET in the CTAT stage; and
configuring the third p-channel MOSFET and the fourth p-channel MOSFET, in parallel, in the output stage.

17. The method of claim 15, wherein the PTAT stage includes the first p-channel MOSFET, the second p-channel MOSFET, an operational amplifier, a resistor, a first diode, and a second diode, and wherein the method further comprises:
coupling an output terminal of the operational amplifier to a first gate of the first p-channel MOSFET and a second gate of the second p-channel MOSFET;
coupling a negative input terminal of the operational amplifier to the first p-channel MOSFET, the first diode, and a first drain of the first p-channel MOSFET;
coupling a positive input terminal of the operational amplifier to the second p-channel MOSFET, the resistor, and a second drain of the second p-channel MOSFET; and
coupling the resistor to the second diode.

18. The method of claim 11, wherein the CTAT stage includes a p-channel MOSFET, an operational amplifier, and a resistor, and wherein the method further comprises:
coupling the resistor to a drain of the p-channel MOSFET;
coupling the drain to a positive input terminal of the operational amplifier;
coupling a negative input terminal of the operational amplifier to the PTAT stage; and
coupling an output terminal of the operational amplifier to a gate of the p-channel MOSFET.

19. The method of claim 11, wherein the PTAT stage includes a first operational amplifier with a first negative input terminal, the CTAT stage includes a second operational amplifier with a second negative input terminal, and wherein the method further comprises coupling the first negative input terminal to the second negative input terminal.

20. The method of claim 19, wherein the PTAT stage further includes a p-channel MOSFET and a diode and wherein the method further comprises coupling the first negative input terminal further to the p-channel MOSFET and the diode.

* * * * *